United States Patent
Kim et al.

(10) Patent No.: US 8,778,207 B2
(45) Date of Patent: Jul. 15, 2014

(54) PLASMA ETCH PROCESSES FOR BORON-DOPED CARBONACEOUS MASK LAYERS

(71) Applicants: Jong Mun Kim, San Jose, CA (US); Jairaj Payyapilly, Sunnyvale, CA (US); Kenny Linh Doan, San Jose, CA (US)

(72) Inventors: Jong Mun Kim, San Jose, CA (US); Jairaj Payyapilly, Sunnyvale, CA (US); Kenny Linh Doan, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 13/651,047

(22) Filed: Oct. 12, 2012

(65) Prior Publication Data

US 2013/0109188 A1    May 2, 2013

Related U.S. Application Data

(60) Provisional application No. 61/552,190, filed on Oct. 27, 2011.

(51) Int. Cl.
*B44C 1/22* (2006.01)
*C03C 15/00* (2006.01)
*C03C 25/68* (2006.01)
*C23F 1/00* (2006.01)

(52) U.S. Cl.
USPC .......................................... 216/81

(58) Field of Classification Search
USPC .......................................... 216/81
See application file for complete search history.

(56) References Cited

U.S. PATENT DOCUMENTS

| | | | |
|---|---|---|---|
| 8,133,819 B2 | 3/2012 | Wang et al. | |
| 2009/0212010 A1* | 8/2009 | Wang et al. | 216/47 |

* cited by examiner

*Primary Examiner* — Roberts Culbert
(74) *Attorney, Agent, or Firm* — Blakely, Sokoloff, Taylor & Zafman LLP

(57) ABSTRACT

Plasma etching of boron-doped carbonaceous mask layers with an etchant gas mixture including $C_xF_y$ or $C_xH_yF_z$, and at least one of COS and $CF_3I$. Etchant gas mixtures may further include a carbon-free fluorine source gas, such as $SF_6$ or $NF_3$, and/or an oxidizer, such as $O_2$, for higher etch rates. Nitrogen-containing source gases may also be provided in the etchant gas mixture to reduce sidewall bowing in high aspect ratio (HAR) feature etches.

20 Claims, 4 Drawing Sheets

PLASMA ETCH PROCESSES FOR BORON-DOPED CARBONACEOUS MASK LAYERS

CROSS REFERENCE TO RELATED APPLICATIONS

This application claims the benefit of U.S. Provisional Application No. 61/552,190 filed on Oct. 27, 2011 titled "Plasma Etch Processes for Boron-Doped Carbonaceous Mask Layers," the entire contents of which are hereby incorporated by reference in its entirety for all purposes.

TECHNICAL FIELD

Embodiments of the present invention relate to the electronics manufacturing industry and more particularly to the process of plasma etching features in boron-rich carbonaceous mask layers.

BACKGROUND

As the feature size of the device patterns get smaller, the critical dimension (CD) requirement of features becomes a more important criterion for stable and repeatable device performance. Allowable CD variation across a substrate has also scaled with the scaling of feature CD. With lateral dimensions scaling faster than vertical dimensions, because of issues such as device capacitance, high aspect ratios (HAR) are now prevalent in the industry. When such demanding aspect ratios and CD control are compounded with requirements of high etch selectivity, sidewall smoothness and high tool throughput, the process window for any hardware configuration can become very small. In many situations, a small process window can be found only when a number of process gases are incorporated into a complex etchant gas mixture combined with extreme hardware settings, such as very high RF bias powers, to achieve a fragile balance between sidewall passivation, etch rate and mask selectivity. However, such small process windows typically suffer from performance limitations which cannot be tuned out of the etch process with known means.

Fabrication techniques often now employ a mask stack that includes non-photo definable material layers disposed below a photo definable layer (i.e., photo resist). The non-photo definable material layers may include a carbonaceous layer, which may be of an inorganic material comprising at least 20 wt % carbon. Included in this class of materials is amorphous carbon, typically comprising greater than 50 wt % carbon, and low-k dielectrics comprising at least 20 wt % carbon content. While improved HAR etch performance is achieved with such carbonaceous masking layers, even greater etch resistance may be provided in boron-doped carbonaceous layers, which include between 1 wt. % and 40 wt. % boron (B). One example of such a boron-doped carbonaceous material is available from Applied Materials, Inc. of Santa Clara, Calif. under the trade name of advanced patterning film (APF), more specifically "APFc."

While a boron-doped carbonaceous mask layer provides improved mask resistance to plasma processes employed to etch an underlying substrate layer (e.g., an interlayer dielectric layer (ILD), and therefore permit an aspect ratio of an opening forming in the underlying layer to be reduced through a thinning of the mask stack, this improved resistance to etching processes also renders the initial opening of the boron-doped carbonaceous layer by a plasma etch "mask open" process more difficult than for boron-free carbonaceous masking layers.

A plasma etch "mask open" process tailored to the etching of a boron-doped carbonaceous layer, such as APFc, is therefore advantageous.

BRIEF DESCRIPTION OF THE DRAWINGS

Embodiments of the present invention are illustrated by way of example, and not limitation, in the figures of the accompanying drawings in which.

DETAILED DESCRIPTION

In the following description, numerous specific details are set forth to provide a thorough understanding of the present invention. It will be apparent to one skilled in the art that the present invention may be practiced without these specific details. In other instances, well-known features, such as specific lithographic patterning and etching techniques, are not described in detail in order to not unnecessarily obscure the present invention. Reference throughout this specification to "an embodiment" means that a particular feature, structure, material, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, materials, or characteristics may be combined in any suitable manner in one or more embodiments. Also, it is to be understood that the various exemplary embodiments shown in the Figures are merely illustrative representations and are not necessarily drawn to scale.

The terms "over," "under," "between," and "on" as used herein refer to a relative position of one layer with respect to other layers. As such, for example, one layer deposited or disposed over or under another layer may be directly in contact with the other layer or may have one or more intervening layers. Moreover, one layer deposited or disposed between layers may be directly in contact with the layers or may have one or more intervening layers. In contrast, a first layer "on" a second layer is in contact with that second layer. Additionally, the relative position of one layer with respect to other layers is provided assuming operations deposit, modify and remove films relative to a starting substrate without consideration of the absolute orientation of the substrate.

Figure 1:
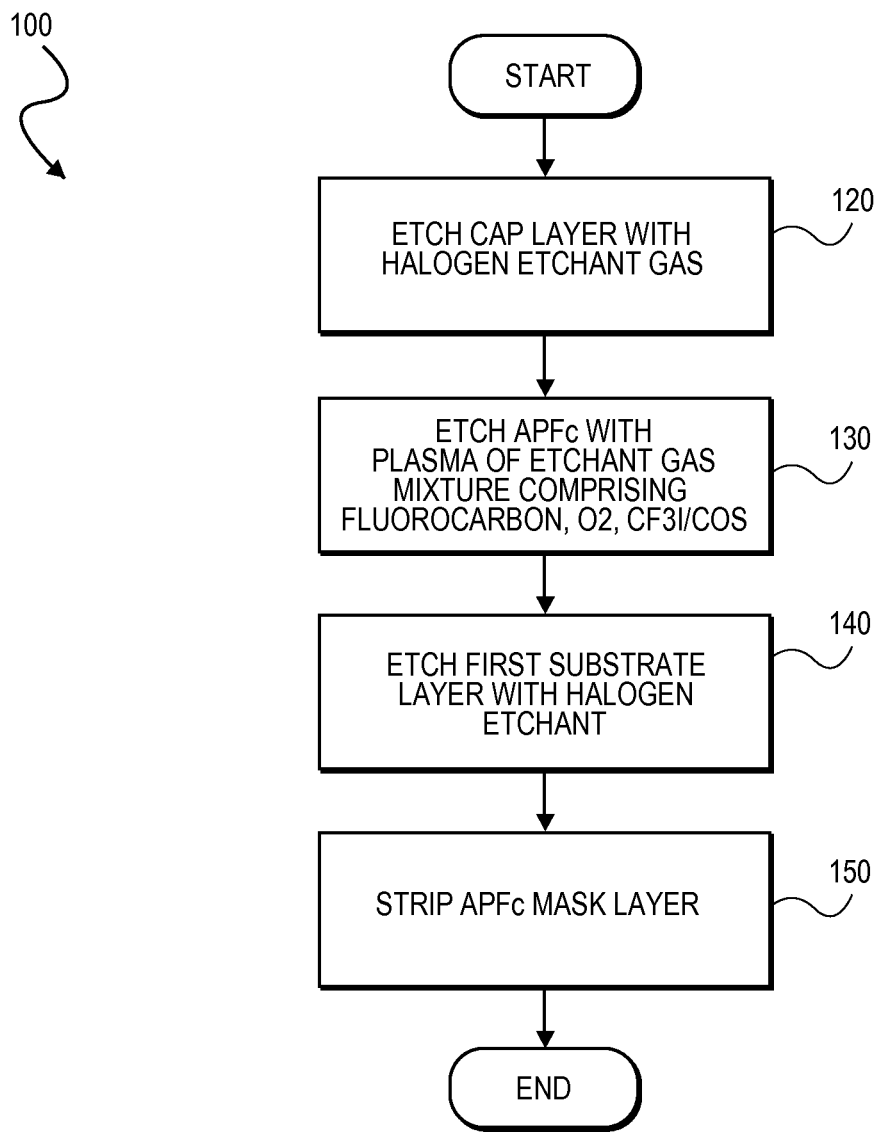
FIG. 1 is a flow chart depicting a method of etching a feature with a multi-layered mask where an amorphous carbon layer of the multi-layered mask is etched with an etchant gas mixture including $CF_3I$ and/or COS, in accordance with a particular embodiment.

FIG. 1 illustrates a flow chart of method 100 for etching a feature in accordance with one embodiment of the present invention. Method 100 is performed upon a substrate during the fabrication process. FIGS. 2A-2F illustrate cross-sectional views of an exemplary substrate having a feature fabricated in accordance with a particular implementation of the flow illustrated in FIG. 1.

Figure 2A:
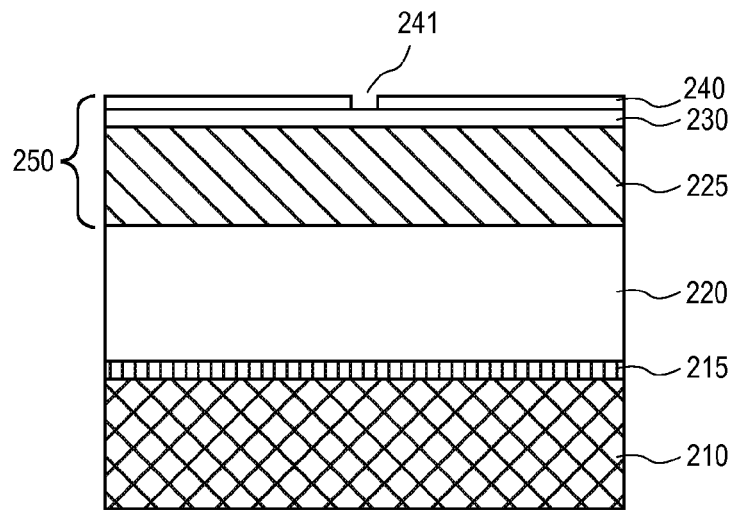
FIGS. 2A, 2B, 2C, 2D, 2E and 2F are cross sectional illustrations depicting an exemplary implementation of the method of FIG. 1, whereby features are etched into a multi-layer mask with an etchant gas mixture including $CF_3I$ and/or COS, in accordance with one embodiment.
Figure 2B:
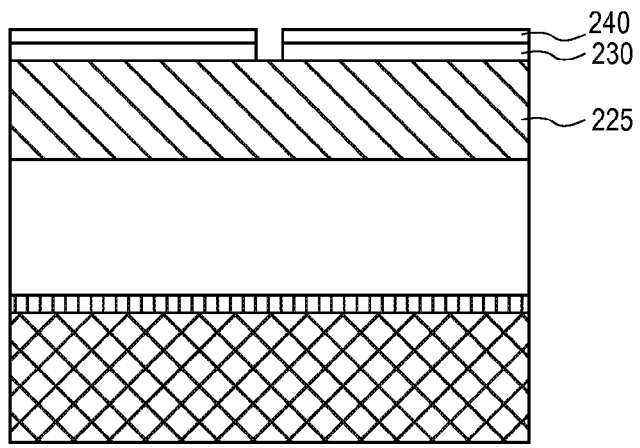
Figure 2C:
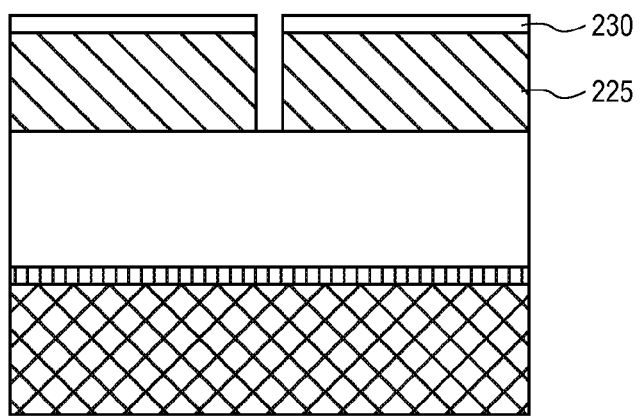
Figure 2D:
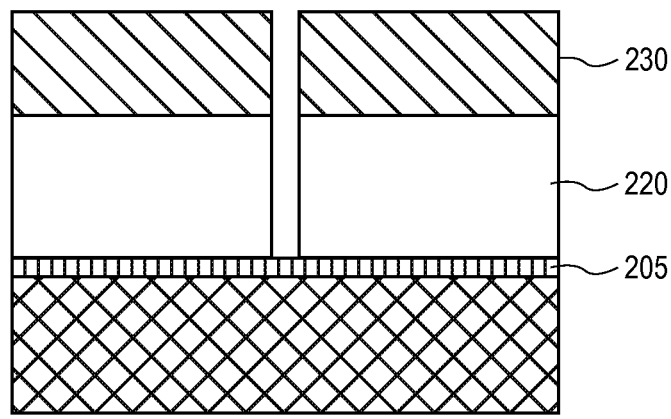
Figure 2E:
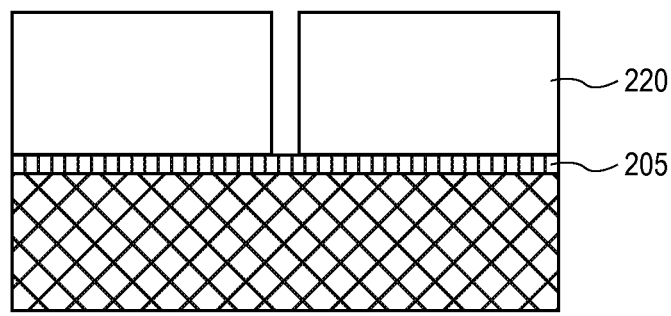

The method 100 begins with workpiece, as depicted in FIG. 2A including a substrate layer 220 on a support 210. In general, the method 100 is applicable to all HAR contact mask open processes of DRAM, flash memory and logic devices as well as HAR line/space patterns (e.g., for gate line, bit line, interconnect line etches). For example, in DRAM applications, capacitor contact etches, buried contact etches, shallow trench isolation etches may be performed by method 100. In logic device fabrication, small feature size contacts (i.e., <30 nm), shallow trench isolation etches, and line/space etches for double patterning techniques may be performed by method 100.

In one embodiment, support 210 is a semiconductor wafer, such as, but not limited to silicon, germanium, or a commonly known III-V compound semiconductor material. In another embodiment, support 210 is a glass or sapphire material. The substrate layer 220 generally comprises either a dielectric layer or a conductor layer. Dielectric embodiments include a silicon dioxide layer having a dielectric constant of approximately 2.5 or a low-k dielectric material, having a dielectric constant of about 2.4 or below, such as, but not limited to, carbon doped silicon oxides. Conductor embodiments included gate materials such as doped polysilicon or commonly employed gate work function metals. It should also be noted that substrate layer 220 may comprise multiple dielectric, semiconductor, or conductor layers of various materials commonly known in the art. In the particular embodiment depicted in FIG. 2A, the substrate layer 220 is on an etch stop layer 215, where etch stop layer 215 comprises a material known to have good selectivity to processes employed for etching the substrate layer 220. In one implementation where the substrate layer 220 comprises silicon dioxide, the etch stop layer 215 comprises silicon nitride.

As further depicted, a boron-doped carbonaceous layer, such as the boron-rich amorphous carbon layer 225, is formed over the substrate layer 220. As used herein, a boron-doped carbonaceous layer includes inorganic layers comprising at least 1 wt % boron and at least 20 wt % carbon. Included in this class of materials is boron-rich amorphous carbon, typically comprising greater than 25 wt % boron and 50 wt % carbon. Excluded from the "boron-doped carbonaceous" class of materials are organic materials having a total carbon content less than 20 wt %, such as those commonly employed as bottom anti-reflective coating (BARC) layers, which typically comprise polyamides and polysulfones and have less than 5 wt % carbon, even if such materials have an appreciable amount of boron although they typically do not incorporate any boron.

The carbonaceous layer may be formed with spray on/spin on methods, with a thermal deposition process (CVD), or a plasma enhanced deposition process (PECVD). In the embodiment depicted in FIG. 2A, the boron-rich amorphous carbon layer 225 is deposited with either CVD or PECVD to form a carbon material comprising at least 50 wt % carbon with sp1, sp2 and sp3 bonding states giving the film properties which are a hybrid of those typical of pyrolylic, graphitic, and diamond-like carbon. Because the deposited boron-doped carbon material may contain a plurality of bonding states in various proportions, it lacks long rang order and so is commonly referred to as "amorphous carbon." In particular embodiments, the amorphous carbon layer 225 may be formed with a PECVD process using hydrocarbon precursors, such as, but not limited to, methane ($CH_4$), propylene ($C_3H_6$), propyne ($C_3H_4$), propane ($C_3H_8$), butane ($C_4H_{10}$), butylenes ($C_4H_8$), butadiene ($C_4H_6$), acetelyne ($C_2H_2$), toluene ($C_7H_8$ ($C_6H_5CH_3$)) and mixtures thereof with a boron source, such as, but not limited to diborane ($B_2H_6$). The boron-doped amorphous carbon layer 225 may also include nitrogen or other additives. An exemplary boron-doped amorphous carbon material is commercially available from Applied Materials, Inc., CA, U.S.A. under the trade name Advanced Patterning Film™ (APF), and more particularly a species of the APF genus of materials known as APFc, which is boron doped.

Boron-doped amorphous carbon layer 225 is not photosensitive and is instead patterned with a plasma etch to reproduce with high fidelity a pattern of an overlying photosensitive layer. The boron-doped amorphous carbon layer 225 is formed with a thickness dependent the material's resistance to the process used to subsequently pattern substrate layer 220 and the structural integrity of the boron-doped carbon material (limiting the aspect ratio of the amorphous carbon layer). In one embodiment, the boron-doped amorphous carbon layer 225 has a thickness, which is approximately 3 times greater than the critical dimension of a feature to be subsequently etched into the layer for an aspect ratio of 3:1. In a further embodiment, the ratio of boron-doped amorphous carbon layer thickness to feature dimension is between 1:1 and 4:1. Such a range of ratios will provide adequate structural integrity so that patterned amorphous carbon features will not collapse during subsequent processing. In one such embodiment, the boron-doped amorphous carbon layer 225 is between approximately 100 nm and approximately 1000 nm. In a particular embodiment including a substrate layer comprising silicon dioxide approximately 1.5 to 2 um thick, the thickness of the amorphous carbon layer is between approximately 300 nm to 700 nm.

As also depicted in FIG. 2A, the boron-doped amorphous carbon layer 225 is capped with an inorganic dielectric cap layer 230. Inorganic dielectric cap layer 230 may serve as a dielectric anti-reflective layer (DARC) and/or improve adhesion of subsequent organic films applied by spin on techniques, which may otherwise not adhere well to the boron-doped amorphous carbon layer 225. Inorganic dielectric cap layer 230 may be a single film or a multi-layered stack of films comprising at least silicon and typically further including nitride, oxygen to form a silicon dioxide, silicon nitride or silicon oxy-nitride (SiON). The composition and thickness of the cap layer 230 may also be tuned to provide minimal reflections and high contrast for a particular wavelength employed during photolithographic patterning of features. In exemplary embodiments, the inorganic dielectric cap layer 230 is formed to a thickness of between about 25 nm and 100 nm, and more particularly between 35 nm and 65 nm.

As further depicted in FIG. 2A, the multi-layered mask 250 includes a patterned photoresist layer 240 after a photolithography operation. In some photoresist embodiments, an organic BARC (not depicted) is applied on the inorganic dielectric cap layer 230 to further reduce reflection of light during patterning of the photosensitive layer. The BARC typically comprises polyamides and polysulfones. While it may be unnecessary to have both an organic BARC and the inorganic dielectric cap layer 230 over the amorphous carbon layer 225, the exemplary embodiment includes a BARC layer.

The patterned photoresist 240 over the boron-doped amorphous carbon layer 225 may be patterned with any conventional means, such as with known photolithography techniques and suitable known resist compositions. In one embodiment, the patterned photoresist 240 includes a contact opening 241 having a critical dimension below about 30 nm.

In a specific implementation, patterned photoresist 240 forms a contact opening having a critical dimension between approximately 10 nm and 30 nm.

Returning to FIG. 1, at operation 120, the inorganic dielectric cap layer 230 is etched as further depicted in FIG. 2. In one advantageous embodiment, the inorganic dielectric cap layer 230 is plasma etched with a conventional halogen-based chemistry, including gases such as, but not limited to fluorocarbons including $C_xF_y$ (e.g., $CF_4$, $C_2F_6$, $C_4F_8$, $C_4F_6$, $C_5F_8$, etc.) and/or $C_xH_yF_z$ (e.g., $CHF_3$, $CH_2F_2$, $CHF_3$, etc.) species. Mixtures including one or more of these may be combined with or without $N_2$. In a further embodiment, the fluorocarbon etchant gas is energized with a low frequency "bias power" RF generator, having a frequency below about 50 MHz, such as the 13.56 MHz and 2 MHz bands. In a further embodiment, high frequency "source power" RF generation, having a frequency above about 100 MHz is preferentially avoided during opening of the inorganic dielectric cap layer 230 to minimize etch bias. A BARC layer, if present, may also be plasma etched with a substantially similar plasma etch process, such that both the organic BARC layer and the inorganic dielectric cap layer 230 may be etched in a single plasma etch process. The duration of operation 120 is dependent on the thickness of the cap layer(s), but, in one embodiment, a 500 nm inorganic dielectric cap layer 230 is cleared in about 50 seconds.

In the embodiment depicted in FIG. 1, at operation 130, one or more fluorocarbon-based chemistries employed for etching the inorganic anti-reflective cap are combined with at least one of carbonyl sulfide (COS) and trifluoroiodomethane ($CF_3I$) to plasma etch the boron-doped amorphous carbon layer 225. While COS, N2, and/or O2 alone, without fluorocarbon species can often be utilized to etch boron-free carbonaceous layers, the greater plasma etch resistance of boron-doped carbonaceous layers is such that a fluorocarbon species is utilized in the exemplary embodiment. The COS and/or $CF_3I$ may primarily serve a sidewall passivation function to reduced undercut and bowing of the etch profile within the boron-doped carbonaceous layer 225. For embodiments including at least one $C_xF_y$ or $C_xH_yF_z$ species and COS, the $C_xF_y$ or $C_xH_yF_z$ species:COS volumetric gas flow ratio is between 1:1 and 2:1. For embodiments including at least one $C_xF_y$ or $C_xH_yF_z$ species and $CF_3I$, the $C_xF_y$ or $C_xH_yF_z$ species:$CF_3I$ ratio is between 2:1 and 4:1. In one exemplary COS embodiment, a $C_xF_y$ or $C_xH_yF_z$ species is provided at 200 sccm and COS at 200 sccm and in one exemplary $CF_3I$ embodiment, a $C_xF_y$ or $C_xH_yF_z$ species is provided at 200 sccm and $CF_3I$ at 50 sccm. Experiments have indicated $CF_3I$-based etch processes provide improved etch profile for a given boron-doped carbonaceous layer etch rate relative to COS-based etch processes, and therefore the preferred embodiment includes at least one $C_xF_y$ or $C_xH_yF_z$ species and $CF_3I$. Though not bound by theory, the improved etch performance it is currently thought to relate to the ability of $CF_3I$ to scavenge F— ions.

In an embodiment, the boron-doped amorphous carbon layer 225 is plasma etched with an etchant gas mixture further include a carbon-free fluorine source gas. In one exemplary embodiment, the carbon-free fluorine source gas is $SF_6$. In another embodiment, the carbon-free fluorine source gas is $NF_3$. These exemplary gases are relatively leaner than those of those gas sources comprising the $C_xF_y$ or $C_xH_yF_z$ species. As such, it has been found that the further addition of a carbon-free fluorine source gas can significantly increase the etch rate of the boron-doped amorphous carbon layer 225 than if the fluorine source gas (or gases) are limited to only fluorocarbons. Generally, it has been found that the carbon-free fluorine source gas may be advantageously provided at volumetric gas flow ratios of between 1:0.25 and 1:1, relative to the $C_xF_y$ or $C_xH_yF_z$ source gas. For one exemplary $SF_6$ embodiment, a wide process window was found where the $SF_6$ is provided at a volumetric flow between 30% and 50% of the $CF_4$ volumetric flow. The total flow rate of the etchant gas mixture may be increased relative to those mixtures described where the carbon-free fluorine source gas is absent, or the flow rate of the fluorocarbon source gas may be reduced to maintain an equivalent total etchant gas mixture flow. In one exemplary embodiment where the etchant gas mixture includes 10-100 sccm $N_2$, 100-200 sccm $C_xF_y$ or $C_xH_yF_z$ species, 100-200 sccm $O_2$, and 25-50 sccm $CF_3I$, 30-100 sccm of $SF_6$ is further included in the etchant gas mixture.

In an embodiment, the boron-doped amorphous carbon layer 225 is plasma etched with an etchant gas mixture further including $O_2$. When energized, particularly with a high frequency RF source power (above about 100 MHz), mixtures of $C_xF_y$ or $C_xH_yF_z$ species and $O_2$ are capable of etching the boron-doped amorphous carbon layer 225 at extremely high rates, well over 1 um/min, however yields highly bowed sidewalls and has a low selectivity over most masking films, such as the inorganic dielectric cap layer 230. It has been found that these deficiencies may be greatly improved with the addition of COS and/or $CF_3I$ with etch rates still being at least 200 nm/min and over 300 nm/min in the exemplary $CF_3I$ embodiment. Therefore, in particular embodiments where the etchant gas mixture consists essentially of a $C_xF_y$ or $C_xH_yF_z$ species, $O_2$, and COS or $CF_3I$, a three component mixture may provide a robust boron-doped amorphous carbon etch process having a large process window. Exemplary flow rates of $O_2$ are 100-200 sccm. As used herein "consists essentially" permits that addition source gases other than those described to the etchant mixture to a level of less than 10% of the total volumetric flow of the etchant mixture. In one particular embodiment, a mixture includes 100-200 sccms $C_xF_y$ or $C_xH_yF_z$ species, and 25-50 sccm $CF_3I$, and 100-200 sccm $O_2$. In another embodiment where a carbon-free fluorine source gas is included, the gas mixture consists essentially of $SF_6$, the $C_xF_y$ or $C_xH_yF_z$ source gas (e.g., $CF_4$), $O_2$, and COS or $CF_3I$.

While three component etchant mixture embodiments provide a significant reduction in sidewall bowing of HAR contacts in boron-doped amorphous carbon layers, in further embodiments, the etchant gas mixture further comprises $N_2$, for example 10-100 sccm $N_2$ in a mixture further including 100-200 sccms $C_xF_y$ or $C_xH_yF_z$ species, 100-200 sccm $O_2$, and 25-50 sccm $CF_3I$. It is also noted that in alternate embodiments, the $N_2$ source may be replaced with other nitrogen sources, such as, but not limited to nitrogen oxides (NO, $N_2O$, etc.) or ammonia ($NH_3$). The etchant gas mixture may further include Ar, for example 0-500 sccm. Ar improves etch profile however, reduces the etch rate of the boron-doped carbonaceous layer 225 relative to the etch rate of the inorganic dielectric cap layer 230 (i.e., reduced selectivity). Inerts other than Ar, such as He, or Xe may also be used in place of Ar.

In embodiments, the process pressure is low to reduce undercut and bowing of the boron-rich carbonaceous layer 225. Exemplary process pressures are below 15 mT and preferably below 10 mT. In one such embodiment, a plasma of a gas mixture including 100-200 sccm $C_xF_y$ or $C_xH_yF_z$ species, 100-200 sccm $O_2$, and 25-50 sccm $CF_3I$ is maintained at a pressure below 10 mT. In further embodiments the substrate is maintained at a temperature of between −10° C. and 10° C. and more particularly between −10° C. and 0° C. throughout the etch of the boron-rich carbonaceous layer 225. To achieve these substrate temperatures, a chuck upon which the substrate is disposed during the etching process is maintained between −40° C. and −20° C. These low process temperatures have been found to significantly improve the etch profile (e.g., reducing bowing) in the boron-rich carbonaceous layer 225. In the exemplary embodiment, a plasma of a gas mixture including 100-200 sccms $C_xF_y$ or $C_xH_yF_z$ species, 100-200 sccm $O_2$, and 25-50 sccm $CF_3I$ is maintained at a pressure below 10 mT while the substrate is between −10° C. and 0° C. throughout the etch of the boron-rich carbonaceous layer 225.

In embodiments, at least one RF generator operating at 2 MHZ, 60 MHz, or 162 MHz energizes the gas mixture into a plasma during the etching of the boron-rich carbonaceous layer 225. The RF energy may be CW (continuous wave) or pulsed at 100-10 KHz pulse frequency. For embodiments employing two or more RF energy sources (generators), one RF generator may be pulsed (single) or more of the RF generators may be pulsed (synchronized). In one embodiment including both a 2 MHz and 60 MHz, bottom (bias) power source and 162 MHz tope (source) power source, the 2 MHz generator may be operated to output 0-1000 W in CW, single pulse mode, or synchronized pulse mode while the 60 MHz generator is operated to output 0-3000 W in CW, single pulse, or synchronized pulse mode. In a further embodiment, both the 2 MHz and the 60 MHz output more than 0 W of power. In further embodiments, the 162 MHz source power is operated at 0-2500 W with CW, single pulse mode or synchronized pulse mode. For embodiments including a high frequency RF excitation of $C_xF_y$ or $C_xH_yF_z$ species/$CF_3I/O_2$ etchant mixtures has been found to provide particularly high boron-doped amorphous carbon etch rates and high selectivity to materials such as the inorganic dielectric cap layer 230. As used herein, high frequency RF refers to "source" powers operating at RF frequencies above about 100 MHz. Low frequency "source" powers operating at RF frequencies at about 60 MHz and below generally provide a significantly lower etch rate of boron-doped amorphous carbon layers than do high frequency sources. The lower etch rate associated with these low RF frequencies in turn requires compensation with, for example, higher $O_2$ flows and high RF powers. As discussed elsewhere herein, both high $O_2$ flow and high powers at low RF frequency are detrimental to maintaining high selectivity to materials such as the inorganic dielectric cap layer 230 and also detrimental to good CD control. Thus, while $C_xF_y$ or $C_xH_yF_z$ species/$CF_3I/O_2$ and $SF_6/C_xF_y$ or $C_xH_yF_z$ species/$CF_3I/O_2$ etchant gas mixtures described herein are generally applicable to any frequency system and may offer improvements relative to other gas mixtures, embodiments where a $C_xF_y$ or $C_xH_yF_z$ species/$CF_3I/O_2/(SF_6)$ etchant gas mixture is combined with high frequency RF may offer a superior process window.

In certain other embodiments, a first etchant gas mixture including a $C_xF_y$ or $C_xH_yF_z$ species, at least one of $CF_3I$ and COS, and $O_2$ is utilized in a first portion of a boron-doped amorphous carbon layer etch and then and a second etchant gas mixture, lacking $CF_3I$ or COS, is employed in a second portion of the boron-doped amorphous carbon layer etch. In one particular embodiment, a three component etchant mixture of a $C_xF_y$ or $C_xH_yF_z$ species, $O_2$ and $CF_3I$ is utilized in a first portion of a boron-doped amorphous carbon layer etch and then a two component etch gas mixture of $O_2$ and the $C_xF_y$ or $C_xH_yF_z$ species is utilized in a second portion of the boron-doped amorphous carbon layer etch. Of course, other components may be added (e.g., $N_2$, Ar, etc.), as previously described such that the absolute number of components is not meant to be limiting with respect to the etch processes described herein, but rather is to illustrate the relative change in the constituents of the gas mixture between phases of the boron-doped amorphous carbon layer etch. Multi-phased processes may be particularly advantageous for very HAR etches to tailor the sidewall profile as the aspect ratio during the first portion reaches about 2:1 to 3:1 and then shifting to the second etchant gas mixture to continue the second portion of the etch to reach aspect ratios of 3:1 or higher. Such multi-step processes provide vertical mask sidewalls for aspect ratios of about 5:1 while still providing cumulative selectivity over inorganic dielectric materials that is greater than 30:1.

Returning to FIG. 1, at operation 140, the main etch is performed using the multi-layered mask patterned by embodiments of the present invention. The main etch uses the multi-layered mask to faithfully transfer a feature formed in the boron-doped amorphous carbon layer 225 into the substrate layer 220, as further shown in FIG. 2E. Depending on the film, various known etch techniques and chemistries may be employed in the main etch, such as, but not limited to, a fluorocarbon-based or chlorofluorocarbon-based plasma etch of a nitride, oxide, semiconductor, or metal substrate film. In an embodiment, the substrate film is defined with features below 30 nm using the multi-layered mask. In one such embodiment, the fluorocarbon includes the $C_xF_y$ or $C_xH_yF_z$ species utilized to etch in the boron-doped amorphous carbon layer 225, however COS and $CF_3I$ are not utilized during the main etch. Furthermore, the flow rate of the $C_xF_y$ or $C_xH_yF_z$ species, plasma process pressure, and/or power levels may be further adjusted from those employed during the mask open process (i.e., during the etching of the boron-doped amorphous carbon layer 225).

At operation 150, an ash or stripping process is used to remove the remainder of the multi-layered mask. In one embodiment, an in-situ strip process is performed in the same etch chamber utilized for operations 120, 130, and 140. In a further embodiment, a high flow of $O_2$ and a relatively lower flow of a $C_xF_y$ or $C_xH_yF_z$ species 0-50 sccm (and no $CF_3I$ or COS), is energized with a high frequency source above about 100 MHz with a power of at least 300 W while a low frequency bias power is less than 150 W. As discussed elsewhere herein, the high frequency source power will erode the boron-doped amorphous carbon layer 225 at a rate not possible with low RF frequencies, such as below about 60 MHz. The in-situ strip also prepares the chamber to repeat method 100 on a subsequent substrate by removing any history effect caused by a main etch of the substrate layer 220.

Figure 2F:
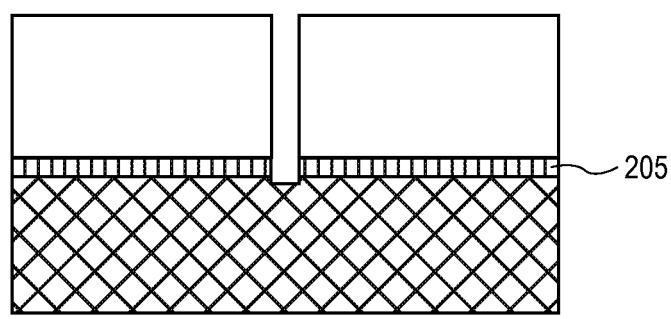

Following the boron-rich amorphous carbon strip operation 150, method 100 of FIG. 1 is substantially completed and the substrate available for further processing, perhaps in the same etch chamber utilized for operations 130, 140 and 150. In a particular embodiment, as depicted in FIG. 2F, an etch stop layer 205 is etched in the same etch chamber as utilized for operation 150 to expose an underlying layer after the amorphous carbon layer 225 has been removed. In other embodiments, the substrate may be processed as conventional in the art after completion of method 100 in FIG. 1.

In one embodiment, a plasma etch apparatus capable of energizing the etchant gas mixture with multiple RF frequencies, such as the Enabler™ etch chamber manufactured by Applied Materials of CA, USA. In another embodiment, the plasma etch processes of method 100 are performed in a magnetically enhanced reactive ion etcher (MERIE) etch chamber, such as the MxP®, MxP+™, Super-E™ or E-MAX® chamber also manufactured by Applied Materials of CA, USA. Other types of high performance etch chambers known in the art may also be used, for example, chambers in which a plasma is formed using inductive techniques.

Figure 3:
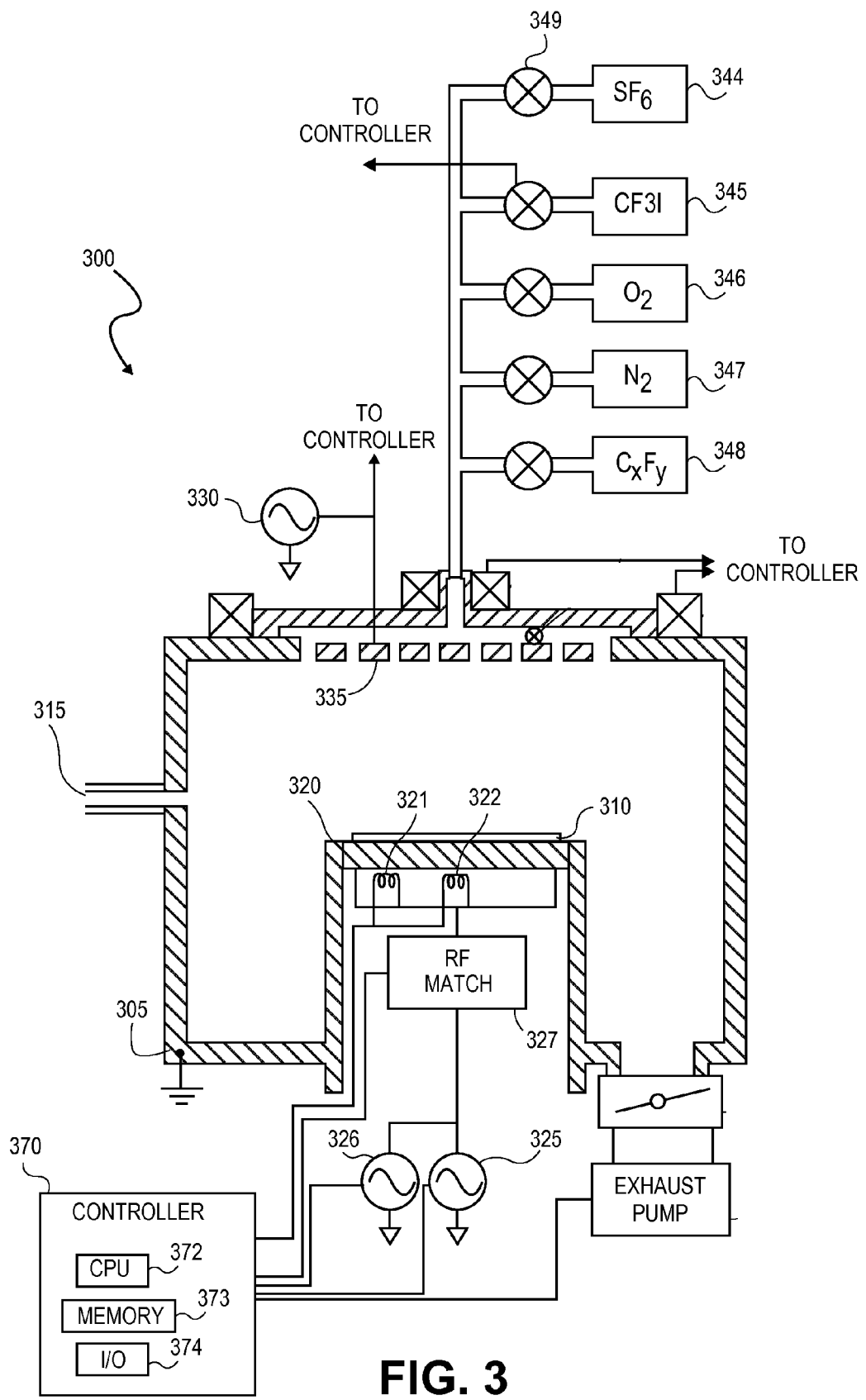
FIG. 3 is a cross-sectional illustration of a plasma etch apparatus configured to perform etch methods in accordance with an embodiment.

A cross-sectional view of an exemplary multi-frequency etch system 300 is shown in FIG. 3. System 300 includes a grounded chamber 305. A substrate 310 is loaded through an opening 315 and clamped to a temperature controlled cathode 320. In particular embodiments, temperature controlled cathode 320 include a plurality of zones, each zone independently controllable to a temperature setpoint, such as with a first thermal zone 322 proximate a center of substrate 310 and a second thermal zone 321 proximate to a periphery of substrate 310. Process gases, are supplied from gas sources 344, 345, 346, 347 and 348 through respective mass flow controllers 349 to the interior of the chamber 305.

When RF power is applied, a plasma is formed in chamber processing region over substrate 310. Bias power RF generator 325 is coupled to cathode 320. Bias power RF generator 325 provides bias power to further energize the plasma. Bias power RF generator 325 typically has a low frequency, and in particular embodiments is 13.56 MHz, or 60 MHz. In certain embodiments where the generator 325 operates at 60 MHz, another bias power RF generator 326 operates at a frequency at about the 2 MHz band which is connected to the same RF match 327 as bias power RF generator 325. Source power RF generator 330 is coupled through a match (not depicted) to a plasma generating element 335 which may be anodic relative to cathode 320 to provide high frequency source power to energize the plasma. Source RF generator 330 typically has a higher frequency than the bias RF generator 325, such as between 100 and 180 MHz, and in a particular embodiment, is in the 162 MHz band. Bias power affects the bias voltage on substrate 310, controlling ion bombardment of the substrate 310, while source power affects the plasma density relatively independently of the bias on substrate 310. It is noted that the etch performance of a given set of input gases from which the plasma is generated varies significantly with a plasma density and wafer bias, thus both the amount and frequency of power energizing the plasma are important. Because substrate diameters have progressed over time, from 150 mm, 200 mm, 300 mm, etc., it is common in the art to normalize the source and bias power of a plasma etch system to the substrate area.

Controller 370 may be one of any form of general-purpose data processing system that can be used in an industrial setting for controlling the various subprocessors and subcontrollers. Generally, controller 370 includes a central processing unit (CPU) 372 in communication with memory 373 and input/output (I/O) circuitry 374, among other common components. Software commands executed by CPU 372, cause system 300 to, for example, load the substrate into a plasma etch chamber, introduce an etchant gas mixture including $O_2$, a $C_xF_y$ or $C_xH_yF_z$ species, and $CF_3I$ or COS, into the plasma etch chamber and etch a boron-doped carbonaceous layer with a plasma of the etchant gas mixture. Other processes, such as etching an inorganic dielectric cap layer over a boron-doped amorphous carbon layer and etching a silicon dioxide dielectric under a boron-doped amorphous carbon layer, in accordance with the present invention, may also be executed by the controller 370.

Portions of the present invention may be provided as a computer program product, which may include a computer-readable medium having stored thereon instructions, which may be used to program a computer (or other electronic devices) to load a substrate into a plasma etch chamber, introduce an etchant gas mixture including $O_2$, a $C_xF_y$ or $C_xH_yF_z$ species, and $CF_3I$ or COS, into the plasma etch chamber and etch a boron-doped carbonaceous layer with a plasma of the etchant gas mixture, in accordance with the present invention. The computer-readable medium may include, but is not limited to, floppy diskettes, optical disks, CD-ROMs (compact disk read-only memory), and magneto-optical disks, ROMs (read-only memory), RAMs (random access memory), EPROMs (erasable programmable read-only memory), EEPROMs (electrically-erasable programmable read-only memory), magnet or optical cards, flash memory, or other commonly known type computer-readable storage medium suitable for storing electronic instructions in a non-transitory fashion. Moreover, the present invention may also be downloaded as a program file containing a computer program product, wherein the program file may be transferred from a remote computer to a requesting computer.

It is to be understood that the above description is intended to be illustrative, and not restrictive. Furthermore, many embodiments other than those described in detail will be apparent to those of skill in the art upon reading and understanding the above description. Although the present invention has been described with reference to specific exemplary embodiments, it will be recognized that the invention is not limited to the embodiments described, but can be practiced with modification and alteration within the spirit and scope of the appended claims. The scope of the invention should, therefore, be determined with reference to the appended claims, along with the full scope of equivalents to which such claims are entitled.

What is claimed is:

1. A method of etching a feature in a boron-doped carbonaceous layer comprising at least 1 wt % boron and at least 20 wt % carbon, the method comprising:
providing a substrate including a patterned photoresist layer disposed above the boron-doped carbonaceous layer;
loading the substrate into a plasma etch chamber;
introducing an etchant gas mixture including a fluorocarbon and $CF_3I$ into the plasma etch chamber;
etching the boron-doped carbonaceous layer with a plasma of the etchant gas mixture.

2. The method of claim 1, wherein the etchant gas mixture further includes COS.

3. The method of claim 1, wherein etching the boron-doped carbonaceous layer further comprises maintaining the substrate at a temperature between 0° C. and −10° C. while etching the boron-doped carbonaceous layer.

4. The method of claim 3, wherein etching the boron-doped carbonaceous layer further comprises maintaining a chuck supporting the substrate at a temperature of between −20° C. and −40° C.

5. The method of claim 1, further comprising etching a substrate layer exposed by an opening formed by the etching of the boron-doped carbonaceous layer.

6. The method of claim 5, wherein the etching of the substrate layer is performed with a plasma comprising the fluorocarbon but without either COS or $CF_3I$.

7. The method of claim 4, wherein etching the boron-doped carbonaceous layer further comprises maintaining the plasma of the etchant gas at a pressure of less than 10 mT.

8. The method of claim 7, wherein etching the boron-doped carbonaceous layer further comprises pulsing at least one RF power energizing the plasma at a frequency of 100-10 KHz.

9. The method of claim 1, wherein the fluorocarbon includes species having the chemical formula $C_xF_y$ or $C_xH_yF_z$.

10. The method of claim 9, wherein the $C_xF_y$ species is selected from the group consisting of: $C_4F_8$, $C_4F_6$, $C_5F_8$, and $CF_4$ and wherein the $C_xH_yF_z$ species is selected from the group consisting of: $CHF_3$, $CH_2F_2$, and $CH_3F$.

11. A method of etching a feature in a boron-doped carbonaceous layer comprising at least 1 wt % boron and at least 20 wt % carbon, the method comprising:

providing a substrate including a patterned photoresist layer disposed above the boron-doped carbonaceous layer;

loading the substrate into a plasma etch chamber;

introducing an etchant gas mixture including a carbon-free fluorine source gas, a fluorocarbon, and at least one of COS and $CF_3I$ into the plasma etch chamber;

etching the boron-doped carbonaceous layer with a plasma of the etchant gas mixture.

12. The method of claim 11, wherein the carbon-free fluorine source gas comprises $SF_6$ and wherein the fluorocarbon includes $CF_4$.

13. The method of claim 12, wherein the $SF_6$ is provided with a volumetric flow of between 30% and 50% that of the $CF_4$.

14. The method of claim 1, wherein the boron-doped carbonaceous layer is a boron-rich amorphous carbon layer comprising at least 25 wt % boron and at least 50 wt % carbon.

15. The method of claim 1, wherein the etchant gas mixture consists essentially of a $C_xF_y$ or $C_xH_yF_z$ species, and $CF_3I$.

16. The method of claim 1, wherein the etchant gas mixture comprises $O_2$ and a nitrogen-containing gas.

17. The method of claim 16, wherein the etchant gas mixture comprises 10-100 sccm $N_2$, 100-200 sccms of the $C_xF_y$ or $C_xH_yF_z$ species, 100-200 sccm $O_2$, and 25-50 sccm $CF_3I$.

18. The method of claim 17, wherein the etchant gas mixture further comprises 30-100 seems $SF_6$.

19. The method of claim 1, further comprising:

etching the boron-doped carbonaceous layer with a first etch step with the plasma including $CF_3I$; and etching the boron-doped carbonaceous layer with a second etch step, subsequent to the first etch step, the second etch step providing a plasma of an etchant gas mixture substantially free of $CF_3I$.

20. A non-transitory computer-readable medium having stored thereon a set of machine-executable instructions which, when executed by a data-processing system, cause a system to perform the plasma etch method of claim 1.

* * * * *

UNITED STATES PATENT AND TRADEMARK OFFICE
CERTIFICATE OF CORRECTION

PATENT NO.        : 8,778,207 B2
APPLICATION NO.   : 13/651047
DATED             : July 15, 2014
INVENTOR(S)       : Kim et al.

It is certified that error appears in the above-identified patent and that said Letters Patent is hereby corrected as shown below:

In the Specification

Column 3, line 26, replace "included gate materials" with "include gate materials"

Column 3, line 62, replace "long rang order" with "long range order"

Column 4, line 15, replace "dependent the material's" with "dependent on the material's"

Column 5, line 31, replace "N2, and/or O2 alone" with "$N_2$, and/or $O_2$ alone"

Column 5, line 37, replace "reduced undercut" with "reduce undercut"

Column 5, lines 52-53, replace "performance it is currently" with "performance is currently"

Column 5, lines 56-57, replace "mixture further include a carbon-free" with "mixture that further includes a carbon-free"

Column 5, lines 60-61, replace "than those of those gas sources" with "than those gas sources"

Column 7, line 27, replace "species/CF3I/O$_2$" with "species/$CF_3I/O_2$"

Column 7, line 43, replace "species/CF3I/O$_2$" with "species/$CF_3I/O_2$"

Column 7, line 44, replace "species/CF3I/O$_2$" with "species/$CF_3I/O_2$"

Column 7, line 47, replace "species/CF3I/O$_2$/(SF$_6$)" with "species/$CF_3I/O_2(SF_6)$"

Column 8, line 47, replace "substrate available" with "substrate is available"
Column 9, line 4, replace "include a plurality" with "includes a plurality"

Signed and Sealed this
Fourteenth Day of October, 2014

Michelle K. Lee
*Deputy Director of the United States Patent and Trademark Office*

In the Claims

Column 12, line 7, replace "30-100 seems $SF_6$" with "30-100 sccm $SF_6$"